United States Patent
Tu

[19]

[11] Patent Number: 5,808,892
[45] Date of Patent: Sep. 15, 1998

[54] LINE EDGE AND SIZE DEFINITION IN E-BEAM EXPOSURE

[75] Inventor: Chih-Chiang Tu, Tau-yang, China

[73] Assignee: Taiwan Semiconductor Manufacturing Company Ltd., Hsin-Chu, Taiwan

[21] Appl. No.: 741,760

[22] Filed: Nov. 5, 1996

[51] Int. Cl.[6] .............................. G06F 19/00; G06G 7/64; G06G 7/66
[52] U.S. Cl. .................... 364/468.28; 364/488; 364/489; 364/490; 347/120; 347/122
[58] Field of Search ............... 364/468.28, 488, 364/489, 490, 491, 497, 498; 250/306, 310, 307, 398, 440, 396, 399, 400, 439, 442; 347/120, 122, 226, 234, 325

[56] References Cited

U.S. PATENT DOCUMENTS

| | | | |
|---|---|---|---|
| 3,922,546 | 11/1975 | Livesay | 250/310 |
| 4,022,927 | 5/1977 | Pfeiffer et al. | 427/43 |
| 4,084,095 | 4/1978 | Wolfe | 250/492 |
| 4,370,554 | 1/1983 | Bohen et al. | 250/491.1 |
| 4,833,621 | 5/1989 | Umatate | 364/491 |
| 5,262,651 | 11/1993 | Frazier et al. | 250/492.2 |
| 5,393,988 | 2/1995 | Sakamoto | 250/492.22 |
| 5,432,714 | 7/1995 | Chung et al. | 364/525 |

*Primary Examiner*—Paul P. Gordon
*Assistant Examiner*—Ramesh Patel
*Attorney, Agent, or Firm*—George O. Saile; Stephen B. Ackerman

[57] ABSTRACT

An e-beam processing method for improving micron and submicron line quality and resolution by selecting one of several recipes each containing recursive expressions for evaluating figure pattern fracturing and e-beam processing parameters based on the size of the figure's width.

16 Claims, 6 Drawing Sheets

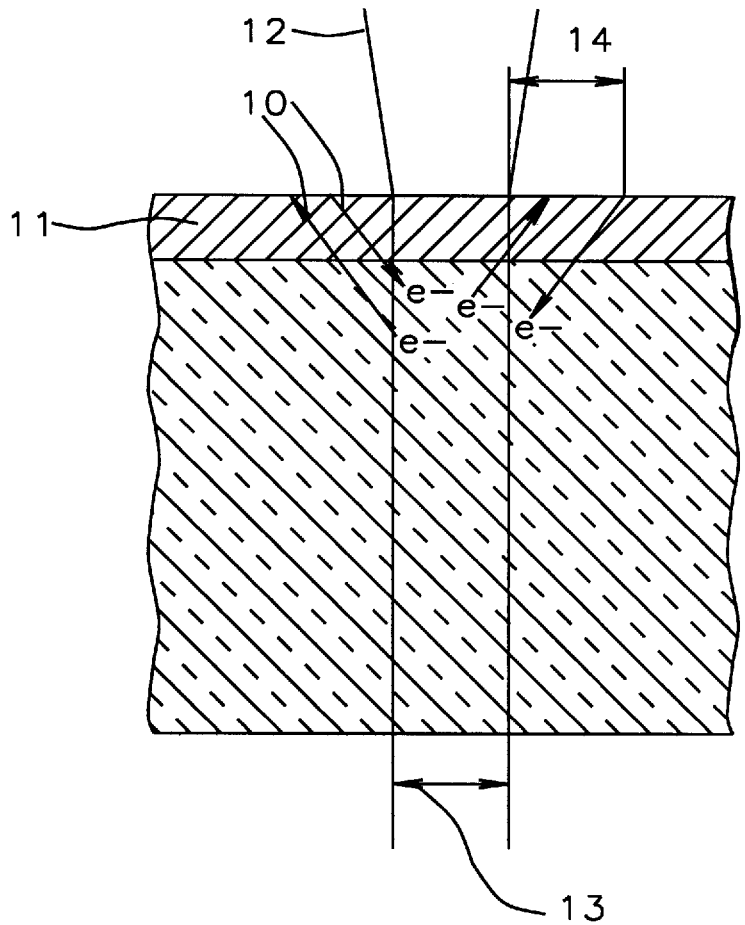
FIG. 1 – Prior Art

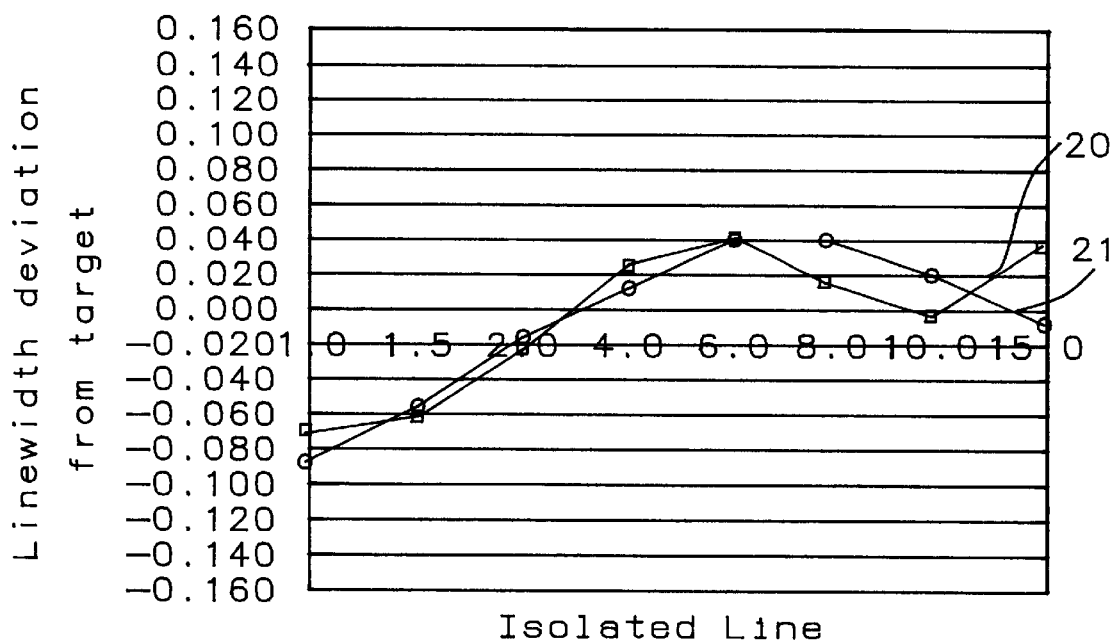
FIG. 2 - Prior Art
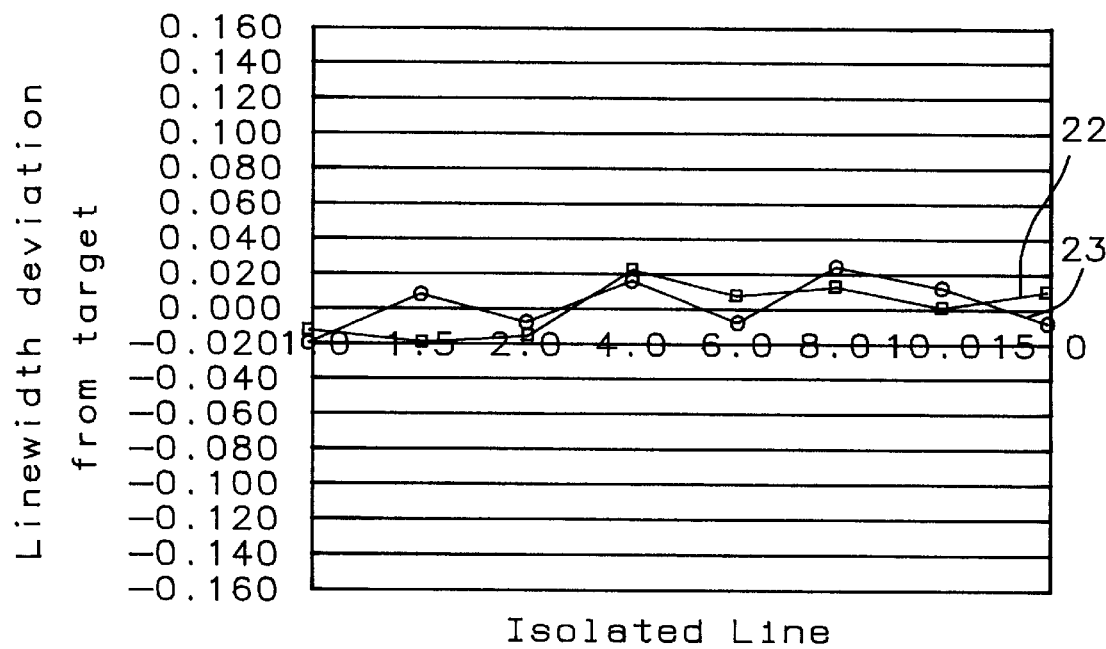
FIG. 3

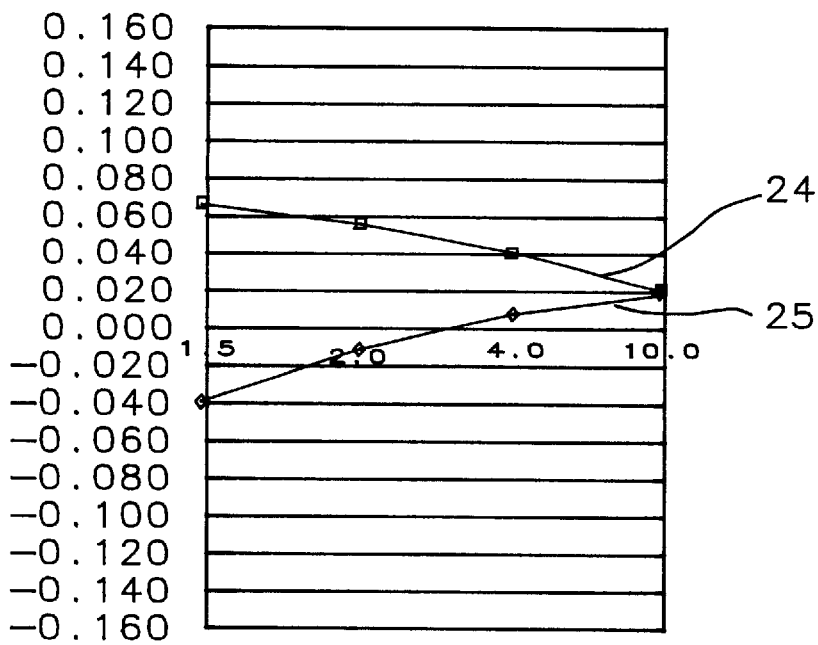
*FIG. 4 - Prior Art*
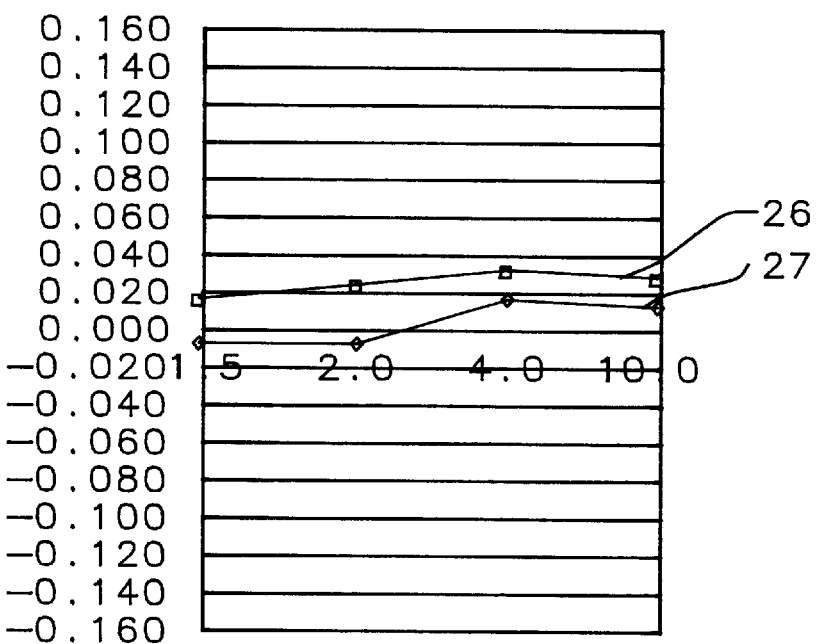
*FIG. 5*

LINE EDGE AND SIZE DEFINITION IN E-BEAM EXPOSURE

BACKGROUND OF THE INVENTION (1) Technical Field

This invention is concerned with a method of forming high definition, high contrast patterns directly on photosensitive coated substrates used in the manufacture of semiconductors. In particular, a demonstrated method is described for improving the quality and speed of e-beam exposure processes by incorporating specific pattern processing and beam parameter controls within e-beam exposure system controllers.

(2) Description of the Prior Art U.S. Pat. No. 4,833,621 issued Jun. 3, 1987 to Toshikazu Umatate discloses a method and apparatus to align a substrate rapidly and accurately. This method involves aligning and exposing substrates in relation to predetermined reference positions. Using design data and measured data, it calculates corrected substrate position values during the manufacture of semiconductor devices.

A wafer for the manufacture of a semi-conductive elements is subjected to numerous sequenced operations which enable the fabrication of all its circuit elements. The use of photo resist material in conjunction with photograhic masks provides the means to transfer the various pattern layers to the semiconductor wafer. The photo mask carries a pattern which is reproduced photographically upon each wafer's surface by projection printing. The layers upon which these images are to be reproduced are either a semiconductor, an oxide on a semiconductor, or a metal film covering the semiconductor.

The image formed in the photo resist can not be better than the photo mask used to determine the exposed and unexposed areas. The most important characteristics that the image must possess are; dimensional correctness, uniform density in both clear and opaque areas, and sharp definition between clear and opaque areas.

In most applications, thousands of images are formed on a single photo mask. A sequenced series of photo masks is required to complete a given semi-conductive device. Each mask controls the exposure of window patterns on wafers coated with photo sensitive resist material. This resist material is processed (developed) to wash away the exposed resist which permits access through the windows for depositing, implanting, or etching a variety of materials.

Multiple mask images which make up a mask series are produced with a defined, closely controlled center-to-center spacing. In most semiconductor manufacturing operations, a series of photo masks are required to produce finished semi-conductive devices. Since the series of masks are used sequentially, mask alignment and the center to center spacing between features produced by successive masks must conform to preceding mask images to form a coherent array of materials in the layers of the devices being built.

In practice, using high grade lenses, a maximum line width of 1 to $2\mu$ meters can be achieved using near ultraviolet light to expose the resist material. As circuit complexity and pattern density increases, micro fabrication for production of integrated circuits must be done with photon, ion or electron particle beams.

Electron beams play a major role in sub-micrometer lithography. Chemical reactions in resist materials (bond breaking or polymerization) initiated by the electron beams is important in e-beam lithography. The energies and range of secondary electrons escaping from the region of interaction between the target and the beam, outside the beam spot area, presently limit the lateral resolution in e-beam lithographic tools. Degradation of lateral resolution in lithography due to these secondary electrons is called "proximity effects". Present correction methods yield large pattern files, long pattern generation times and long e-beam exposure times with minimal gain in the definition of product features.

Additionally, the natural repelling forces of like charges and the electron's sensitivity to magnetic forces, known as "coulomb effects", distorts the e-beam's shot size and its projected exposure focal plane. Both the "proximity" and "coulomb effects" seriously impacts the critical dimension quality of the circuit pattern.

SUMMARY OF THE INVENTION

The present invention discloses a method of improving circuit pattern resolution on resist coated substrates during e-beam exposure.

It is an object of the present invention to provide a method of selectively assigning figure pattern fracturing, e-beam dosage and beam size build up parameters to optimize feature definition classes of figure patterns. This processing can be incorporated into an e-beam tool controller.

BRIEF DESCRIPTION OF THE DRAWINGS

FIG. 1 is a prior art illustration of the resolution problems caused by secondary electrons.

FIG. 2 is a prior art example of line width linearity without proximity correction.

FIG. 3 is an example,of the invention, of line width linearity with proximity correction.

FIG. 4 is a prior art example of line uniformity without proximity correction.

FIG. 5 is an example, of the invention, of line uniformity with proximity correction.

DETAILED DESCRIPTION OF THE PREFERRED EMBODIMENT

Figure 6:
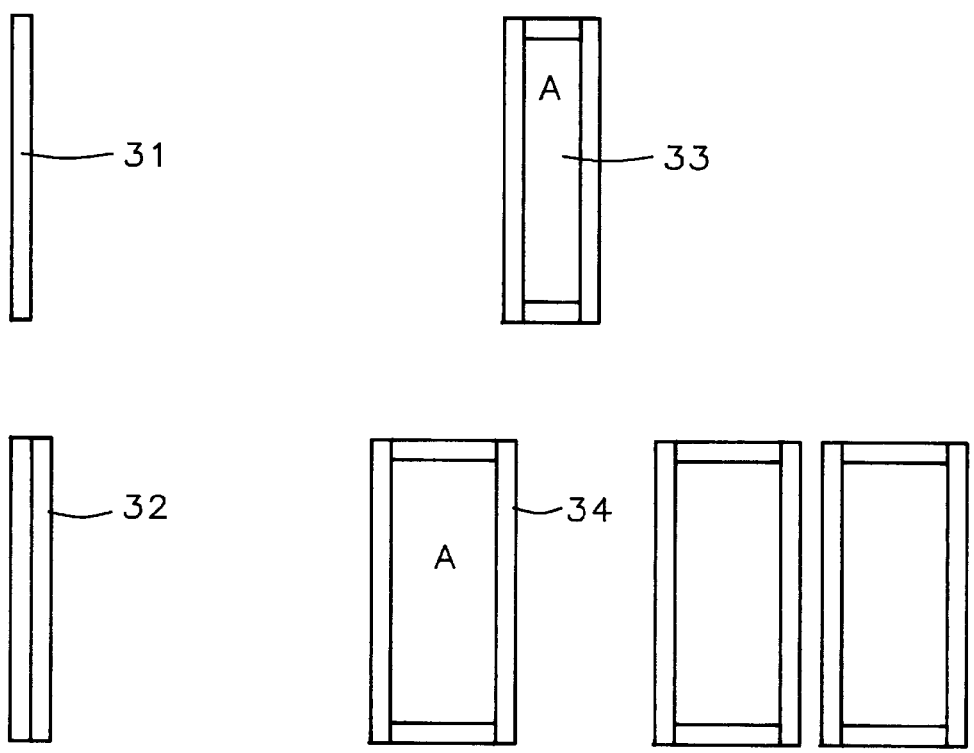
FIG. 6 illustrates figure fracturing of the invention.

FIG. 1 illustrates how secondary electrons 10 escaping from the region of photo resist 11 between the target and the beam 12, outside the beam spot area 13,limits the lateral resolution 14 shown exposed by the diverging back scattered secondary electrons 10. This consequence is defined as "aproximity effects". Plotted in FIG. 2 are the effects of these secondary electrons on line width (width linearity). An isolated line's width is measured at its center to its outer edge at intervals along a length segment as plotted in curve 20. Curve 21 is a plot of the space variance between two line segments. FIG. 4 shows how proximity effects alters the pitch spacing between a ruling pattern containing a plurality of parallel lines. Curve 24 and 25 represents the variance of parallelism between two lines, in this case curve 25 is a plot of the first line in a ruling pattern and curve 24 the forth line in the same pattern.

FIG. 6 graphically illustrates the term "figure fracturing" or the breaking up of a line segment into smaller pieces. Line segment 31 having a width dimension of less than 0.25 $\mu$m can be generated without fracturing. Line segment 32 having a width that is greater than 0.25 μm and is less than 1.0 μm would be fractured and generated into half figures as shown. Line segment 33 having a width greater than 1.0 μm but less than 4.0 μm would be fractured into an outer frame and inner segment. Line segment 34 with a width greater than 4.0 μm would be fractured into an outer frame and inner segment as in line 33 but would be generated with a different dosage setting as explained in the following paragraphs.

Figure 7:
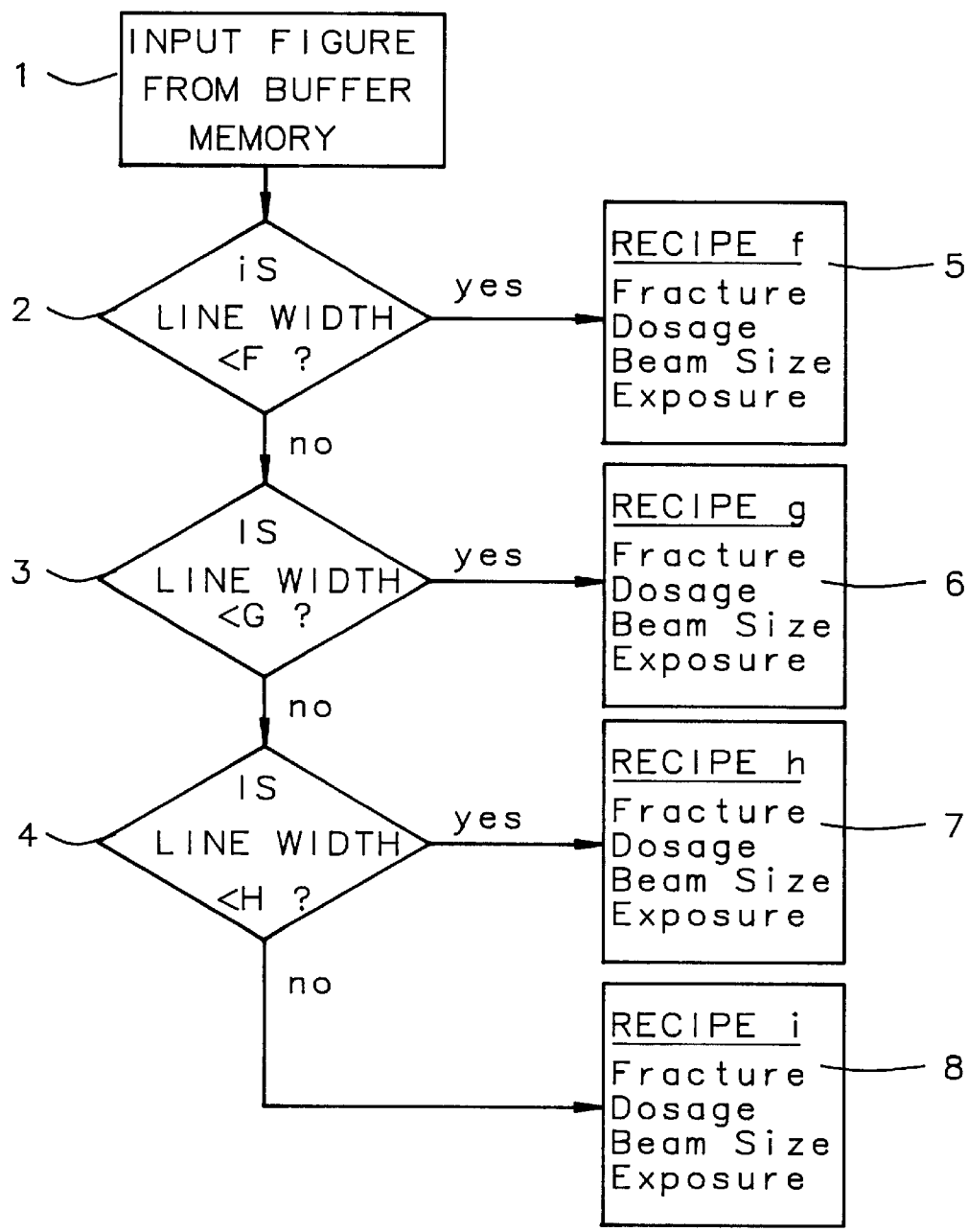
FIG. 7 is a flow chart, of the invention, illustrating the selection of tool control recipes based on feature size in each input figure.

Referring now more particularly to FIG. 7 there is shown a flow diagram for a method to select, based on feature size, an algorithm of figure pattern fracturing and e-beam processing parameters. For each figure processed, the line width is extracted by the analysis in block1 and determined by the decision blocks 2,3, and 4 to be within one of four feature class definitions. These classes are defined by class boundaries (for illustrative purposes, and not limited to F=0.25 μm, G=1.0 μm, H=4.0 μm.) These boundaries define the following feature size classes: under 0.25 μm, at least 0.25μ but under 1.0 μm, at least 1.0 μm but under 4.0 μm and over 4.0 μm. For each of the four classes of input figures, a separate algorithm(f,g,h,i) for e-beam exposure control is chosen. The algorithms contain the process rules which control fracturing of the image, e-beam process tool beam dosage, and the beam size build up limit.

The four algorithms each define three control e-beam process variables: figure fracturing, e-beam dose assignment and beam size build up limit. The e-beam dose, $\epsilon/cm^2$, is calculated by an equation which uses scalar process constants A through E, assigned for illustration only to the following values.

A=3.8
B=50
C=35
D=25
E=0

Algorithm "f" (see FIG. 7, item 5.)

Assuming F=0.25 μm and an input figure is processed with a feature class "f" is activated which calls for:

No figure fracturing.

Dosage=A(1+B %)$\epsilon/cm^2$, 3.8(1+50%), or 5.7$\epsilon/cm^2$.

Beam size build up: Max. 0.25 μm×2.0 μm.

Algorithm "g" (see FIG. 7, item 6.)

Assuming G=1.0 μm and an input figure is processed with a feature less than 1.0 μm and not class "f", the recipe for feature class "g" is activated which calls for:

Figure fracturing into half figures.

Dosage=A(1+C %)$\epsilon/cm^2$ or 3.8(1+35%) or 5.13$\epsilon/cm^2$.

Beam size build up: Max. 0.4 μm×2.0 μm.

Algorithm "h" (see FIG. 7, item 7.)

Assuming H=4.0 μm and an input figure is processed with a feature less than 4.0 μm and not class "f" or "g", the recipe for feature class "h" is activated which calls for:

Figure fracturing into outer frame part and inner part.

Dosage for frame part=A(1+D %)$\epsilon/cm^2$ or 3.8(1+25%) or 4.75$\epsilon/cm^2$.

Beam size build up for frame part 0.25 μm frame width, 2.0 μm length.

Beam size build up for inner part Max. 4.0 μm×4.0 μm.

Algorithm "g" (see FIG. 7, item 8)

Assuming H=4.0 μm and an input figure is processed with a feature equal or greater than 4.0 μm (not class "f" or "g" or "h"), the recipe for feature class "i" is activated which calls for:

Figure fracturing into out frame part and inner part.

Dosage for frame part=A(1+E %)$\epsilon/cm^2$ or 3.8(1+0%) or 3.8$\epsilon/cm^2$.

Dosage for inner part=A $\epsilon/cm^2$ or 3.8$\epsilon/cm^2$

Beam size build up for frame part 0.25 μm frame width, 2.0 μm length/Beam size build up for inner part Max. 4.0 μm×4.0 μm.

FIG. 3 illustrates improvements to line width quality using the correction algorithms. Curve 22 and 23 show improvement plots to line width linearity from >0.1 μm as shown in FIG. 2 to <0.05 μm in FIG. 3 for isolated line widths ranging from 1.0 μm to 15.0 μm.

FIG. 5 shows improvements in pitch line uniformity after applying the correction algorithms to a set of parallel lines ranging from 1.5 to 4.0 μm wide. Curve 26 is a uniformity plot of the forth line of the pattern and curve 27 is a uniformity plot: of the first line. Comparing FIG. 5 to FIG. 4 indicates the degree of improvement that is typical between line pairs.

Figure 8:
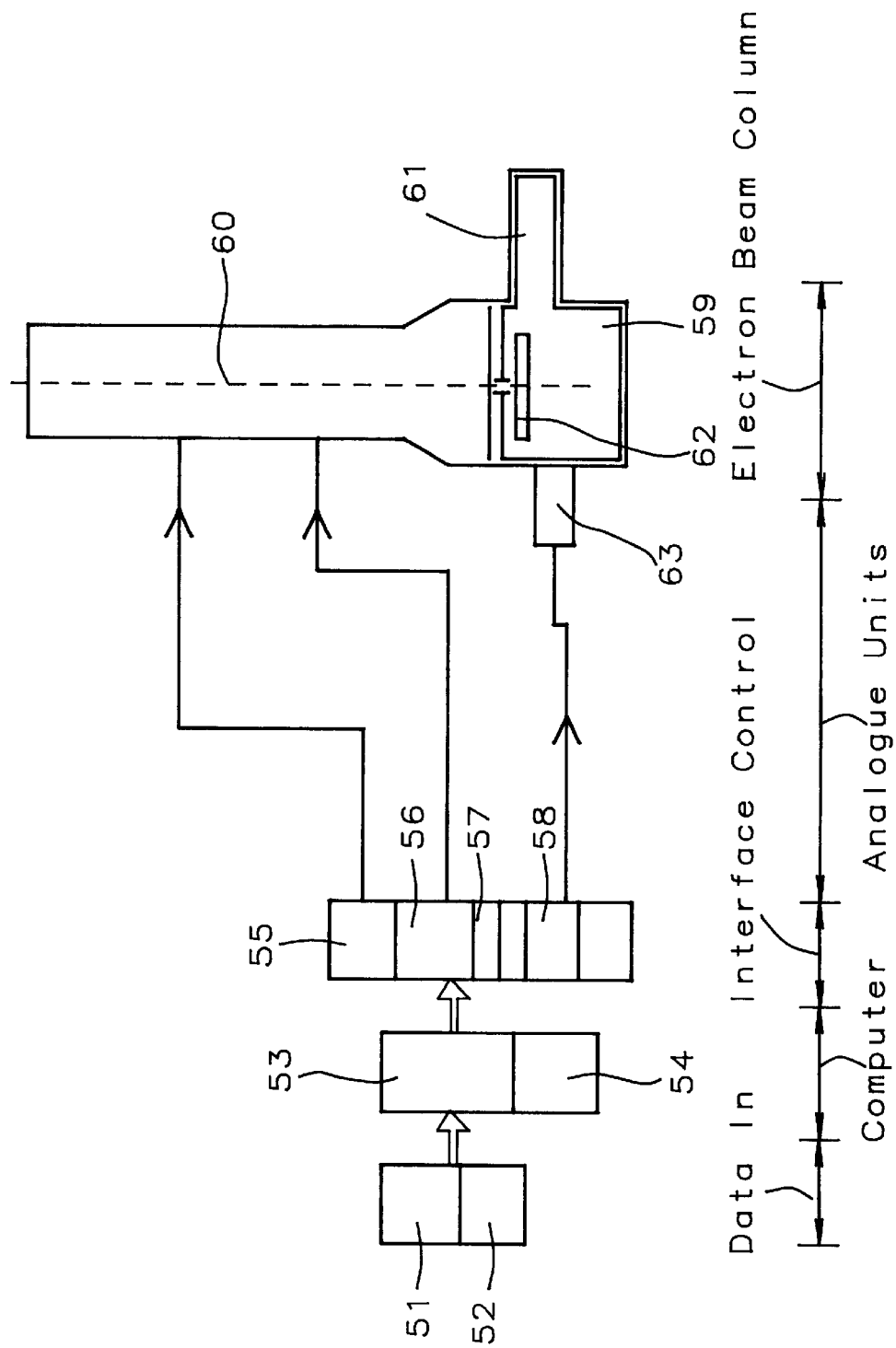
FIG. 8 is a diagrammatic scheme of an e-beam machine.

FIG. 8 depicts a schematic of an electron beam machine. Pattern data are synthesized as a series of rectangles and read into the computer 53 either via a tape reader 51 or manually via a key board 54. The computer is programmed to accept and store the pattern information and to transfer it to the interface control unit 57 in blocks of words which define each rectangle. The interface control unit 57 receives the digital information from the computer 53 and converts it into analogue signals to control the electron beam 60 and workstage 62. The workpiece substrate is placed into an airlock 61 and thereon to the workstage. The workstage control 58 controls and drives motor 63. The present invention incorporates within the interface control unit 57 a process of sorting, grouping and assigning an algorithmic recipe to control the electron beam's operating parameters.

While the invention has been particularly shown and described with reference to the preferred embodiments thereof, it will be understood by those skilled in the art that various changes in form and details may be made without departing from the spirit and scope of the invention.

What is claimed is:

1. An e-beam pattern processing method for improving micron and submicron line quality and resolution by limiting distortions caused by proximity and coulomb effects comprising the steps of:

a) incorporating a process of translating pre-processed pattern data for line segment sorting by data control at the e-beam's interface control unit; and b) grouping all line segments by their width and assigning an algorithmic recipe for each group for adjusting and controlling the e-beam's operating parameters.

2. An e-beam pattern processing method according to claim 1 wherein line width size sorting by data control at the e-beam's interface control unit comprises grouping line width sizes into classes for fracturing or not fracturing.

3. An e-beam pattern processing method according to claim 1 wherein said algorithmic recipes contain boundaries for each (size) width class.

4. An e-beam pattern processing method according to claim 1 wherein said operating parameters comprises modulating the e-beam's dose amount using dimension-less process constants A thru E assigned to the following values;

A=3.8
B=50
C=35
D=25
E=0.

5. An e-beam pattern processing method according to claim 1 wherein said operating parameters further comprises adjusting said e-beam's size relative to the degree of line width fracturing.

6. An e-beam pattern processing method according to claim 1 wherein improving said micron and submicron line resolution comprises controlling the e-beam's size and dosage for reducing the beam's deviation and defocusing caused by coulomb effects.

7. An e-beam processing method for selecting one of several recipes each containing recursive expressions for evaluating figure pattern fracturing and e-beam processing parameters based on the width of the figure pattern comprising the steps of:

a) receiving an input figure from buffer memory into an e-beam tool controller; and b) selecting an algorithmic recipe in the e-beam tool controller's data control based on a width class of the input figure pattern.

8. The e-beam processing method according to claim 7 wherein said recipe for an input width class having a feature that is less than 0.25 $\mu$m wide will not require fracturing but needs a beam size build up of 0.25 $\mu$m×2.0 $\mu$m and an adjusted dosage of A(1+B %)$\epsilon$/cm$^2$, wherein A,B and $\epsilon$ are process parameters.

9. An e-beam processing method according to claim 7 wherein said recipe for an input width class having a feature 60 that is greater than 0.25 $\mu$m but less than 1.0 $\mu$m requires fracturing into two half figures each requiring a beam size build up of 0.4 $\mu$m×2.0 $\mu$m and an adjusted dosage of A(1+B %)$\epsilon$/cm$^2$ wherein A, B and $\epsilon$ are process parameters.

10. An e-beam processing method according to claim 7 wherein said recipe for an input width class having a feature that is less than 4.0 $\mu$m but greater than 1.0 $\mu$m requires fracturing into:

a) an outer frame needing a beam size build up of 0.25 $\mu$m×2.0 $\mu$m and an adjusted dosage of A(1+D %)$\epsilon$/cm$^2$ wherein A,D and $\epsilon$ are process parameters; and b) an inner part needing a beam size build of 4.0 $\mu$m×4.0 $\mu$m and an adjusted dosage of A $\epsilon$/cm$^2$ wherein A, D and $\epsilon$ are process parameters.

11. An e-beam processing method according to claim 7 wherein said recipe for an input width class having a feature that is equal to or greater than 4.0 $\mu$m requires fracturing into:

a) an outer frame needing an adjusted dosage of A(1+E %)$\epsilon$/cm$^2$ and a beam size build up of 0.25 $\mu$m×2.0 $\mu$m wherein A, E and $\epsilon$ are process parameters; and b) an inner part needing an adjusted dosage of A$\epsilon$/cm$^2$ and a beam size build up of a maximum 4.0 $\mu$m×4.0 $\mu$m wherein A and $\epsilon$ are process parameters.

12. An electron beam lithography machine, comprising:

a) a means for generating an electron beam used to define a pattern in photoresist on a semiconductor substrate;

b) a means for regulating a dosage of said electron beam;

c) a means for fracturing a feature width dimension of said circuit pattern;

d) a means for building up a beam size of said electron beam;

e) an electron beam interface control unit which controls said regulating means, said fracturing means, and said building up means, based on a line segment width to be formed on said silicon substrate.

13. An electron beam lithography machine according to claim 12 wherein said interface control unit receives an input figure from buffer memory that is less than 0.25 $\mu$m wide requires:

a) no fracturing:

b) adjusting the beam size to 0.25 $\mu$m×2.0 $\mu$m; and c) the dosage to A(1+B %)$\epsilon$/cm$^2$, wherein A,B and $\epsilon$ and process parameters.

14. An electron beam lithography machine according to claim 12 wherein said interface control unit receives an input figure from buffer memory width is greater than 0.25 $\mu$m but less than 1.0 $\mu$m requires:

a) fracturing the feature into two half figures;

b) building the beam size to 0.4 $\mu$m×2.0 $\mu$m; and c) adjusting the dosage to A(1+B %)$\epsilon$/cm$^2$ wherein A, B and $\epsilon$ are process parameters.

15. An electron beam lithography machine according to claim 12 wherein said interface control unit receives an input figure from buffer memory that is less than 4.0 $\mu$m but greater than 1.0 $\mu$m requires:

a) fracturing into an outer frame needing a beam size build up of 0.25 $\mu$m×2.0 $\mu$m and an adjusted dosage of A(1+D %)$\epsilon$/cm$^2$ wherein A,D and $\epsilon$ are process constants; and b) an inner part needing a beam size build up of 4.0 $\mu$m×4.0 $\mu$m and an adjusted dosage of A×$\epsilon$/cm$^2$ wherein A and $\epsilon$ are process parameters.

16. An electron beam lithography machine according to claim 12 wherein said interface control unit receives an input figure from buffer memory that is equal to or greater than 4.0 $\mu$m requires:

a) fracturing into an outer frame needing a beam size build up of 0.25 $\mu$m×2.0 $\mu$m and an adjusted dosage of A(1+E %)$\epsilon$/cm$^2$ wherein A,E and $\epsilon$ are process constants; and b) an inner part needing a beam size build up of 4.0 $\mu$m×4.0 $\mu$m maximum and an adjusted dosage of A×$\epsilon$/cm$^2$ wherein A and $\epsilon$ are process parameters.

* * * * *